(12) United States Patent
Matsuoka et al.

(10) Patent No.: US 6,503,836 B2
(45) Date of Patent: Jan. 7, 2003

(54) METHOD AND APPARATUS FOR MANUFACTURING SEMICONDUCTOR DEVICE

(75) Inventors: Takeru Matsuoka, Hyogo (JP); Takashi Yamashita, Hyogo (JP); Takao Kamoshima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 30 days.

(21) Appl. No.: 09/782,281

(22) Filed: Feb. 14, 2001

(65) Prior Publication Data

US 2002/0019134 A1 Feb. 14, 2002

(30) Foreign Application Priority Data

Aug. 8, 2000 (JP) ........................................ 2000-239511

(51) Int. Cl.$^7$ ............................................. H01L 21/302
(52) U.S. Cl. ........................................ 438/691; 438/692
(58) Field of Search ................................ 438/783, 784, 438/690, 691, 692, 693

(56) References Cited

U.S. PATENT DOCUMENTS 5,341,014 A * 8/1994 Fuji et al. ................... 257/377
5,716,891 A * 2/1998 Kodama ...................... 438/783
6,127,244 A * 10/2000 Lee .............................. 438/455
6,150,244 A * 11/2000 Ni ............................... 438/300
6,200,865 B1 * 3/2001 Gardner et al. ............. 438/197

FOREIGN PATENT DOCUMENTS

| JP | 9-162144 | 6/1997 |
| JP | 9-326393 | 12/1997 |
| JP | 11-154677 | 6/1999 |

* cited by examiner

*Primary Examiner*—Benjamin L. Utech
*Assistant Examiner*—Kin-Chan Chen
(74) *Attorney, Agent, or Firm*—McDermott, Will & Emery

(57) ABSTRACT

A method and apparatus for manufacturing a semiconductor device having an interlayer insulating film of improved flatness after a CMP process are obtained. The method includes the steps of: heat-treating a semiconductor device having an interlayer insulating film containing impurities; conducting a process for making an impurity-concentration distribution at an upper layer portion of the interlayer insulating film substantially uniform after the heat treatment; and polishing the interlayer insulating film by a CMP process after the process for making the impurity-concentration distribution substantially uniform.

14 Claims, 10 Drawing Sheets step 1

METHOD AND APPARATUS FOR MANUFACTURING SEMICONDUCTOR DEVICE

BACKGROUND OF THE INVENTION

1. Field of the Invention

The present invention generally relates to a method and apparatus for manufacturing a semiconductor device having an interlayer insulating film, and more particularly, to a method and apparatus for manufacturing a semiconductor device having an interlayer insulating film of improved flatness after a CMP (Chemical Mechanical Polishing) process.

2. Description of the Background Art

An interlayer insulating film of a semiconductor device is formed by heat-treating an insulating film of BPTEOS (Boro-Phospho-Tetra-Ethyl-Ortho-Silicate), BPSG (Boro-Phospho-Silicate-Glass) or the like and flattening the resultant film by the CMP process. Degraded flatness of the interlayer insulating film causes contact misalignment or the like, thereby making it difficult to realize miniaturization of the semiconductor device. Therefore, with the progress in miniaturization of the semiconductor devices, some proposals have been made to improve the flatness of the interlayer insulating film.

For example, a method for manufacturing a semiconductor device having an interlayer insulating film of which flatness is improved in consideration of underlying projections and impurity concentration has been proposed (Japanese Patent Laying-Open No. 11-154677). In FIG. 15, a semiconductor substrate 101 has projections 106 such as gate electrodes and interconnections at its surface, and an interlayer insulating film is deposited thereon. The surface of the interlayer insulating film includes small bumps reflecting individual projections 106, and large, gentle bumps reflecting the density of the projections such as the gate electrodes. In general, in flattening the interlayer insulating film, such small bumps are naturally polished away while the large bumps are being polished.

In this method, as shown in FIG. 15, the interlayer insulating film has a two-layer structure of a high-concentration impurity layer 122 and a low-concentration impurity layer 102. High-concentration impurity layer 122 having a thickness that is equal to or larger than the height of projections 106 is formed at a surface-layer region of the interlayer insulating film, so that high-concentration impurity layer 122 is distinguished from low-concentration impurity layer 102 formed thereunder. It should be understood that the interface between high-concentration impurity layer 122 and low-concentration impurity layer 102 as well as the surface of high-concentration impurity layer 122 both include bumps reflecting projections 106. When the interlayer insulating film is polished by the CMP process, high-concentration impurity layer 122 is first polished. As shown in FIG. 16, at a stage $t_1$ of the process, polishing of high-concentration impurity layer 122 is completed as well as polishing of low-concentration impurity layer 102 is started in a projecting portion corresponding to a high projection density. This is because such a projecting portion is polished at a higher rate. At stage $t_1$, however, high-concentration impurity layer 122 is still being polished in a recessed portion corresponding to a low projection density, because such a recessed portion is polished at a lower rate. In other words, at stage $t_1$, a surface including both low-concentration impurity layer 102 (i.e., a region corresponding to the high projection density) and high-concentration impurity layer 122 (i.e., a region corresponding to the low projection density) is polished. A portion having projections 106 thereunder is polished at a higher rate than a portion having no projection 106 thereunder. Moreover, since high-concentration impurity layer 122 is soft, it is polished at a higher rate than low-concentration impurity layer 102. Therefore, at stage $t_1$ as shown in FIG. 16, the surface including both low-concentration impurity layer 102 and high-concentration impurity layer 122 is polished, but both regions are polished at approximately the same rate. Accordingly, when high-concentration impurity layer 122 has been polished away from the polish surface, a highly flat interlayer insulating film can be obtained.

In order to suppress the impurity diffusion, reduction in time and temperature of the heat treatment is an essential requirement for the recent semiconductor devices. Therefore, RTP (Rapid Thermal Process) is used for the heat treatment. However, such reduction in temperature is strongly required even in the RTP that uses a higher heating temperature than that of a furnace-anneal process. Such a short-time RTP has a large temperature variation between the portions of a heat-treated semiconductor device (wafer). Therefore, a concentration distribution of impurities such as B (boron) and P (phosphorus) within the interlayer insulating film is varied, thereby inevitably resulting in a non-uniform impurity-concentration distribution. Accordingly, the interlayer insulating film has undesirably degraded flatness after the subsequent CMP process. It should be noted that, in the specification, the heat treatment refers to anneal processes including RTP and furnace anneal.

The above-mentioned phenomenon is exemplarily described for a semiconductor device including a MOSFET (Metal Oxide Semiconductor Field Effect Transistor) with reference to FIGS. 17 to 20.

FIG. 17 is a cross-sectional view illustrating processes of degassing (outgassing) and pre-flattening an interlayer insulating film in the RTP. In FIG. 17, an interlayer insulating film 102 is formed on a semiconductor substrate 101 including a semiconductor-element portion such as a gate. A semiconductor device including interlayer insulating film 102 is heated by an RTP apparatus 103. FIG. 18 is an enlarged view of a cross section taken along the line Y1–Y2 of FIG. 17. At the surface of the semiconductor substrate 101, source/drain regions 105 are formed with a channel region therebetween, and gate electrodes 106 are formed on the respective channel regions. An element-isolating region 104 is formed between the elements. The interlayer insulating film 102 has small bumps at its surface due to the projections of the underlying gate electrodes 106. The purpose of the RTP is to activate impurities in a region of the semiconductor substrate as well as to bake the interlayer insulating film.

FIG. 19 is a diagram showing impurity-concentration distribution profiles along the line X1–X2 (FIG. 18) at the surface of interlayer insulating film 102 before and after the RTP. In FIG. 19, an impurity-concentration distribution E1 before anneal is flat, whereas an impurity-concentration distribution E2 after the RTP is raised in the center of the line X1–X2. A wavelength of such a variation in the impurity-concentration profile is much larger than that of the profile of the bumps produced by gate electrodes 106 of FIG. 18. A region having an increased impurity concentration has reduced hardness. Therefore, when the interlayer insulating film having impurity-concentration distribution E2 of FIG. 19 is subjected to the CMP process, the resultant interlayer insulating film has a (film-thickness distribution G2 as shown in FIG. 20. More specifically, even if the interlayer insulating film has a flat film-thickness distribution G1 before the CMP process, the interlayer insulating film subjected to the CMP process has film-thickness distribution G2 that is reduced in the center. This is because a region having a high impurity concentration is polished at a high rate. It is difficult to obtain a uniform film thickness by the CMP process. Therefore, the impurity-concentration distribution must be made uniform before the CMP process.

SUMMARY OF THE INVENTION

It is an object of the present invention to provide a method and apparatus for manufacturing a semiconductor device having an interlayer insulating film of improved flatness after a CMP process by making uniform a non-uniform impurity-concentration distribution resulting from heat treatment corresponding to miniaturization of the semiconductor devices.

A method for manufacturing a semiconductor device according to one aspect of the present invention includes the steps of: heat-treating a semiconductor device having an interlayer insulating film containing impurities; conducting a process for making an impurity-concentration distribution at an upper layer portion of the interlayer insulating film substantially uniform after the heat treatment; and polishing the interlayer insulating film by a CMP process after the process for making the impurity-concentration distribution substantially uniform.

In such a method, it is assumed that the interlayer insulating film has a non-uniform impurity-concentration distribution as a result of the heat treatment. If the interlayer insulating film having the non-uniform impurity-concentration distribution is subjected to the CMP process, the resultant interlayer insulating film has a non-uniform thickness distribution. Accordingly, the impurity concentration is reduced by out-diffusion so that the concentration of impurities such as B (boron), P (phosphorus) and As (arsenic) at the upper layer portion of the interlayer insulating film is reduced. In the out-diffusion, impurities in a high-impurity-concentration region are first discharged into an atmosphere. Accordingly, the interlayer insulating film has a reduced, substantially uniform impurity concentration as a result of the heat treatment. When the interlayer insulating film having such a substantially uniform impurity concentration is subjected to the CMP process, every region thereof is polished at the same rate, whereby flatness of the resultant interlayer insulating film is improved. In the process of making the impurity concentration substantially uniform, the interlayer insulating film may alternatively have an increased, substantially uniform impurity concentration as a result of the heat treatment.

This heat treatment is conducted in order to bake the interlayer insulating film as well as to activate the impurities in a semiconductor substrate. It should be noted that the expression "a process for making an impurity-concentration distribution substantially uniform" as used herein refers to a process for obtaining such a concentration distribution that every region of the interlayer insulating film is polished at substantially the same rate in the CMP process and that a highly flat interlayer insulating film is obtained as a result of the CMP process. The upper layer portion of the interlayer insulating film generally refers to a portion of the interlayer insulating film that is polished in the CMP process after the heat treatment such as RTP.

In the method for manufacturing a semiconductor device according to the above-mentioned one aspect of the present invention, the process for making the impurity-concentration distribution substantially uniform may include, for example, the step of introducing impurities into the upper layer portion of the interlayer insulating film.

There have been developed a number of methods for introducing impurities into a semiconductor device. By using an appropriate one of the methods, the impurities can be introduced to make the non-uniform impurity-concentration distribution uniform. The impurity-concentration distribution is made uniform at least to the depth to which the interlayer insulating film is polished in the CMP process.

In the method for manufacturing a semiconductor device according to the above-mentioned one aspect of the present invention, the impurities may, for example, be selectively introduced into a specific region of the interlayer insulating film.

By introducing the impurities into a lower-impurity-concentration region of the interlayer insulating film so that the impurity concentration of the region becomes equal to the highest concentration in the impurity-concentration distribution of the interlayer insulating film, a uniform impurity-concentration distribution can be efficiently obtained. In order to selectively introduce the impurities into the low-impurity-concentration region, a method such as ion implantation may be conducted by using a resist formed on a high-impurity-concentration region by a photolithography technique. Thus, the selective introduction of impurities can be easily realized.

In the method for manufacturing a semiconductor device according to the above-mentioned one aspect of the present invention, the impurities may be introduced into, for example, the whole surface of the interlayer insulating film at a concentration higher than the original impurity concentration of the interlayer insulating film.

In the case where the impurities are introduced at a concentration significantly higher than the original impurity concentration of the interlayer insulating film, these impurities are uniformly introduced into the entire interlayer insulating film so that the resultant interlayer insulating film has a high impurity concentration. At this time, the impurities originally contained in the interlayer insulating film are ignored. Therefore, a substantially flat, high impurity-concentration distribution can be obtained. Thus, uniformity of a thickness distribution of the interlayer insulating film after the CMP process can be improved by a convenient method.

In the method for manufacturing a semiconductor device according to the above-mentioned one aspect of the present invention, the impurities are desirably introduced by using the ion-implantation method, wherein the impurities in the range of $10^{14}/cm^2$ to $5 \times 10^{15}/cm^2$ are desirably implanted at 10 keV to 50 keV.

By implanting such an amount of impurities, the polishing rate of the interlayer insulating film in the CMP process becomes substantially independent of the impurity-concentration distribution before the impurity implantation. Therefore, as a result of implanting the impurities at the high concentration, every region of the interlayer insulating film is polished at substantially the same rate, whereby the flatness of the interlayer insulating film is improved. Note that the implantation energy of 10 keV to 50 keV is the energy at which the impurities are distributed in the upper layer portion of the interlayer insulating film.

In the method for manufacturing a semiconductor device according to the above-mentioned one aspect of the present invention, the process for making the impurity-concentration distribution substantially uniform may include, for example, the step of conducting heating so as to cause out-diffusion of the impurities from the upper layer portion of the interlayer insulating film.

When the whole surface of the interlayer insulating film is heated, the impurities in the interlayer insulating film are out-diffused first from a high-impurity-concentration region, whereby the impurity concentration of the region is reduced. Therefore, the interlayer insulating film has an averaged overall impurity concentration, whereby the overall flatness of the interlayer insulating film after the CMP process can be improved. It is also possible to selectively heat a specific high-impurity-concentration region of the interlayer insulating film so as to cause out-diffusion of the impurities on a region-by-region basis.

In the method for manufacturing a semiconductor device according to the above-mentioned one aspect of the present invention, a specific region of the interlayer insulating film, for example, may be selectively heated to cause selective out-diffusion of the impurities.

A specific high-impurity-concentration region of the interlayer insulating film is heated to cause out-diffusion so that the impurity concentration of the region becomes equal to the lowest concentration in the impurity-concentration distribution of the interlayer insulating film. Thus, a uniform impurity-concentration distribution can be obtained. In this case, no resist is necessary. In other words, the impurities can be out-diffused by merely selectively heating the specific region.

In the method for manufacturing a semiconductor device according to the above-mentioned one aspect of the present invention, the whole surface of the interlayer insulating film, for example, may be heated to cause out-diffusion of the impurities.

When the whole surface of the interlayer insulating film is heated, the impurities in the interlayer insulating film are out-diffused first from a high-impurity-concentration region, whereby the impurity concentration of the region is reduced. Therefore, the interlayer insulating film has a substantially uniform overall impurity concentration, whereby the overall flatness of the interlayer insulating film after the CMP process can be improved.

A method for manufacturing a semiconductor device according to another aspect of the present invention includes the steps of: heat-treating a semiconductor device having an interlayer insulating film containing impurities; and polishing the interlayer insulating film by a CMP process after the heat treatment, wherein the heat treatment is conducted so as to obtain a substantially uniform impurity-concentration distribution.

According to such a method, the impurity-concentration distribution is substantially uniform after the heat treatment. Therefore, a highly flat interlayer insulating film can be obtained by the CMP process without conducting a process for making the impurity-concentration distribution substantially uniform.

In the method for manufacturing a semiconductor device according to the above-mentioned another aspect of the present invention, the heat treatment conducted so as to obtain a substantially uniform impurity-concentration distribution may include, for example, the steps of depositing a non-doped interlayer insulating film on the interlayer insulating film containing the impurities, and heat-treating the semiconductor device including both the interlayer insulating film containing the impurities and the non-doped interlayer insulating film, and in the CMP process, the interlayer insulating films may be polished down to an upper layer portion of the interlayer insulating film containing the impurities.

In the case where such a two-layer interlayer insulating film having the non-doped layer as an upper layer is subjected to the heat treatment as described above, a variation in the heat-treatment conditions and the like results only in slight diffusion of the impurities into the non-doped layer. Therefore, the impurities are not re-distributed within a plane of the interlayer insulating film in which they are originally present. Accordingly, no distinct wave is produced in the impurity-concentration distribution profile, whereby a uniform impurity-concentration distribution can be obtained. The following CMP process is conducted so that the first (upper) interlayer insulating film is polished away and the second (lower) interlayer insulating film is polished down to a prescribed level of its upper layer portion. As a result, excellent flatness can be obtained.

In the method for manufacturing a semiconductor device according to the above-mentioned another aspect of the present invention, the heat treatment conducted so as to obtain a substantially uniform impurity-concentration distribution may include, for example, the step of heat treating the semiconductor device including the interlayer insulating film at its surface by using an active-gas atmosphere.

According to such a method, a layer reacted with the active gas is formed at a surface layer of the interlayer insulating film, whereby out-diffusion of the impurities is blocked. As a result, the interlayer insulating film has a substantially uniform impurity concentration at its upper layer portion before and after the heat treatment. Therefore, excellent flatness of the interlayer insulating film can be assured after the CMP process.

In the method for manufacturing a semiconductor device according to the above-mentioned another aspect of the present invention, the active gas is desirably either an oxygen gas ($O_2$) or a nitrogen oxide gas ($NO_x$).

The active gas is a readily available gas. By using such an active gas, the active-gas reaction layer is reliably formed at the surface layer of the interlayer insulating film, whereby out-diffusion of the impurities can be prevented.

In the method for manufacturing a semiconductor device according to the above-mentioned another aspect of the present invention, the heat treatment conducted so as to obtain a substantially uniform impurity-concentration distribution may include, for example, the step of dividing the interlayer insulating film into a plurality of regions and heat-treating the interlayer insulating film on a region-by-region basis by using a region-based heating apparatus.

By dividing the interlayer insulating film into a plurality of regions and conducting the heat treatment in a plurality of steps, adjustment for assuring flatness of the interlayer insulating film after the CMP process is facilitated. The number of steps of the heat treatment need not necessarily be the same as the number of regions, and is usually less than the number of regions. In addition, the regions that are subjected to the steps of the heat treatment may partially overlap each other. By providing such an overlap, out-diffusion of the impurities and the like are facilitated, and the impurity-concentration distribution is adjusted. Thus, flatness of the interlayer insulating film can be improved.

In the method for manufacturing a semiconductor device according to the above-mentioned another aspect of the present invention, the heat treatment conducted so as to obtain a substantially uniform impurity-concentration distribution may include, for example, the steps of: heating a specific region of the semiconductor device by a partial heating apparatus; and scan-heating the semiconductor device, i.e., heating the semiconductor device while moving at least one of the semiconductor device and the partial heating apparatus, wherein the semiconductor may be scan-heated in a reciprocating manner.

In such a method, for example, the scan-heating is always conducted in the reciprocating manner in order to cancel the tendency for the interlayer insulating film to have an increased thickness at its end where the heating is insufficient in the initial heating. Accordingly, uniform temperature control is possible, whereby non-uniform re-distribution of the impurities due to the non-uniform temperature distribution of the heat treatment is prevented. As a result, excellent flatness can be assured after the CMP process.

An apparatus for manufacturing a semiconductor device according to the present invention includes a partial heating apparatus capable of heating a partial region of a surface of a semiconductor wafer having at the surface an interlayer insulating film containing impurities.

The partial heating apparatus includes a region-based heating apparatus, and a heating apparatus used in the scan-heating. By using the region-based heating apparatus, an appropriate set of regions is heated for out-diffusion of the impurities contained in a high-impurity-concentration region, whereby the impurity concentration of that region is reduced. Thus, a uniform impurity concentration distribution can be obtained. As a result, flatness of the interlayer insulating film after the CMP process can be improved.

Moreover, by using the scan-heating apparatus, partial heating is conducted while scanning a sample in one direction as well as in another direction by a scanning section, whereby local deviation of the temperature history can be prevented. As a result, the interlayer insulating film has a uniform impurity concentration, and a highly flat interlayer insulating film can be obtained by the CMP process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention are described with reference to the accompanying drawings.

(Embodiment 1)

Figure 1:
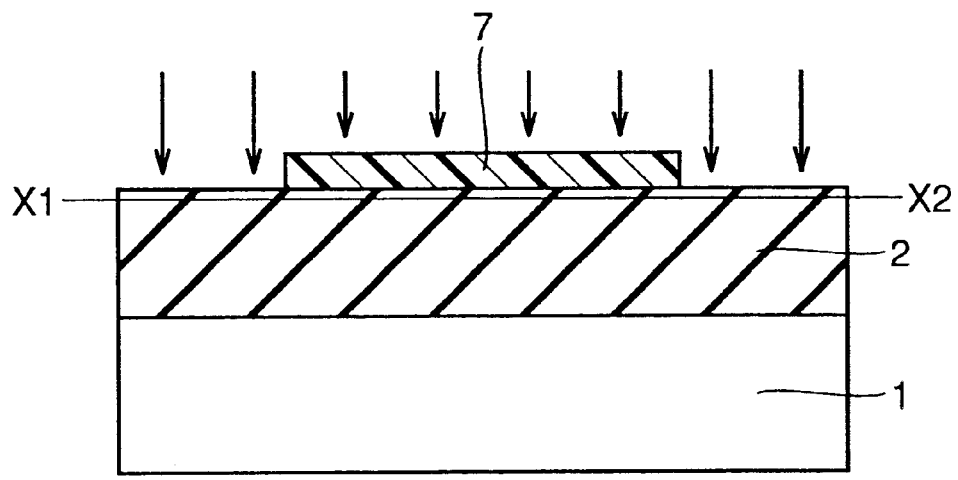
FIG. 1 is a diagram illustrating the step of implanting impurities into an interlayer insulating film by using a resist in a method for manufacturing a semiconductor device according to Embodiment 1 of the present invention.

In FIG. 1, an interlayer insulating film 2 is formed on a semiconductor substrate 1 including MOSFET elements. In order to improve a non-uniform impurity-concentration distribution of interlayer insulating film 2 resulting from an RTP, interlayer insulating film 2 is protected by a resist 7 in a high-impurity-concentration region by using a photolithography technique. Thereafter, impurity ions are implanted into a low-impurity-concentration region of interlayer insulating film 2 in order to compensate for the difference in the impurity concentration. Thus, a uniform impurity-concentration distribution is obtained. The conditions of ion implantation are determined by a thickness of a film to be polished and impurity concentration of the film.

Figure 2:
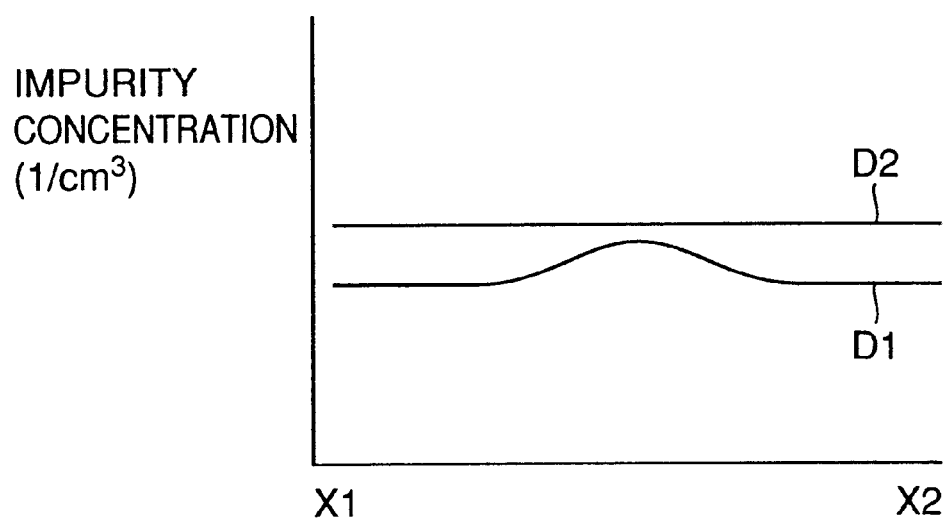
FIG. 2 is a diagram showing a uniform impurity-concentration distribution of the interlayer insulating film, which is obtained by the manufacturing method of FIG. 1.

As shown in FIG. 2, interlayer insulating film 2 has a non-uniform impurity-concentration distribution D1 along the line X1–X2 of FIG. 1 before ion implantation. However, by such ion implantation to the low-impurity-concentration region, a uniform impurity-concentration distribution D2 can be obtained. As a result, every region is polished at a uniform rate in a CMP process, whereby a highly flat interlayer insulating film can be obtained.

(Embodiment 2)

Figure 3:
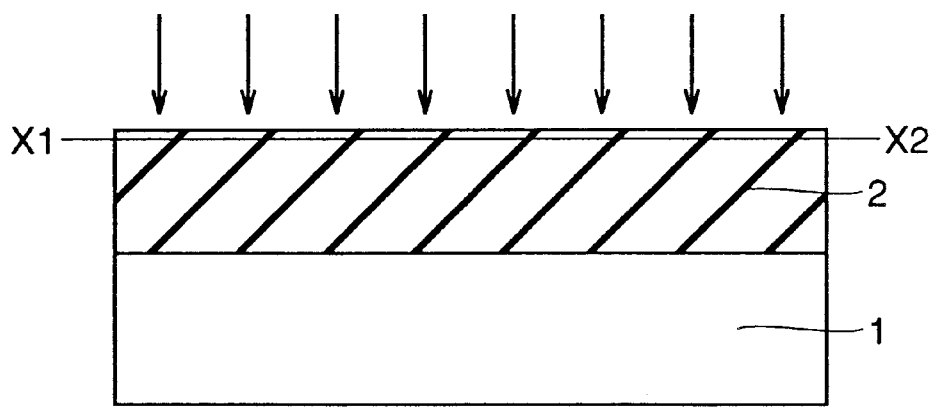
FIG. 3 is a diagram illustrating the step of uniformly implanting impurities into the entire interlayer insulating film in a method for manufacturing a semiconductor device according to Embodiment 2 of the present invention.
Figure 4:
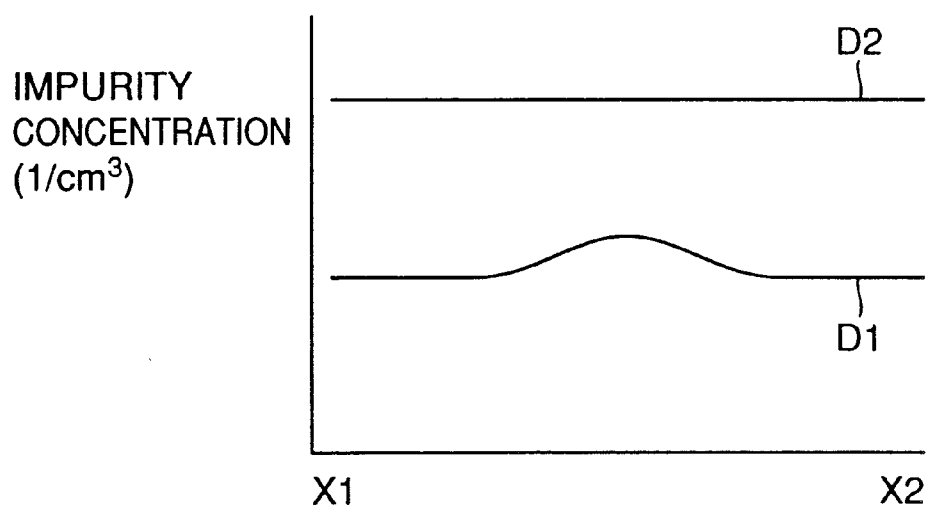
FIG. 4 is a diagram showing a uniform impurity-concentration distribution of the interlayer insulating film, which is obtained by the manufacturing method of FIG. 3.

In the present embodiment, impurities are uniformly introduced into the whole surface of interlayer insulating film 2 at a concentration higher than the original impurity concentration of interlayer insulating film 2. FIG. 3 is a diagram illustrating a method for introducing impurities into the entire interlayer insulating film 2 by the ion implantation method. In this case, impurity ions such as B (boron) ions or P (phosphorus) ions in the range of $10^{14}/cm^2$ to $5\times10^{15}/cm^2$ are implanted at the implantation energy of 10 keV to 50 keV. Since the original impurity concentration D1 of interlayer insulating film 2 can be substantially ignored, a substantially uniform impurity-concentration distribution D2 is obtained along the line X1–X2 of FIG. 3, as shown in FIG. 4. As a result, every region is polished at substantially the same rate in the CMP process, whereby a highly flat interlayer insulating film can be obtained.

(Embodiment 3)

Figure 5:
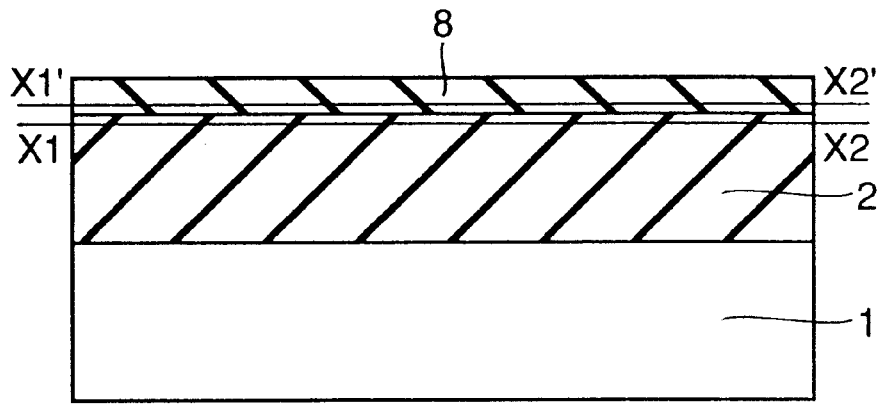
FIG. 5 is a diagram illustrating the step of depositing a non-doped interlayer insulating film on an interlayer insulating film in a method for manufacturing a semiconductor device according to Embodiment 3 of the present invention.

In order to prevent out-diffusion in the RTP, i.e., a phenomenon in which impurities are discharged away from the interlayer insulating film, a non-doped second interlayer insulating film 8 is deposited on the original first interlayer insulating film 2 before the RTP, as shown in FIG. 5. In order to prevent the out-diffusion, second interlayer insulating film 8 needs to have a thickness of about 50 nm to about 200 nm, and is formed by using a thermal CVD (Chemical Vapor Deposition) or plasma CVD process.

Figure 6:
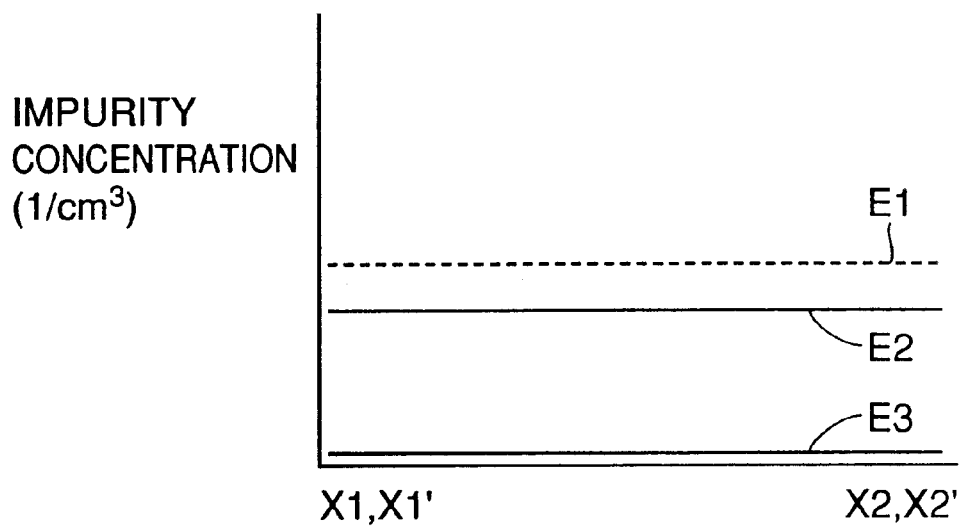
FIG. 6 is a diagram showing impurity-concentration distributions in the interlayer insulating films of Embodiment 3.

As shown in FIG. 6, because of non-doped second interlayer insulating film 8, first interlayer insulating film 2 has an impurity-concentration distribution E2 along the line X1–X2 of FIG. 5 after the heat treatment. The impurity-concentration distribution E2 is flat, while being lower than an impurity-concentration distribution E1 before the heat treatment. Also as shown in FIG. 6, non-doped second interlayer insulating film 8 has a low, flat impurity-concentration distribution E3 at its surface layer along the line X1'–X2' of FIG. 5, due to slight impurity diffusion from first interlayer insulating film 2 thereinto.

Because of such uniform impurity-concentration distributions, every region is polished at the same rate in the CMP process. Therefore, a highly flat interlayer insulating film can be obtained after the CMP process, whereby a highly reliable, miniaturized semiconductor device can be provided.

(Embodiment 4)

Figure 7:
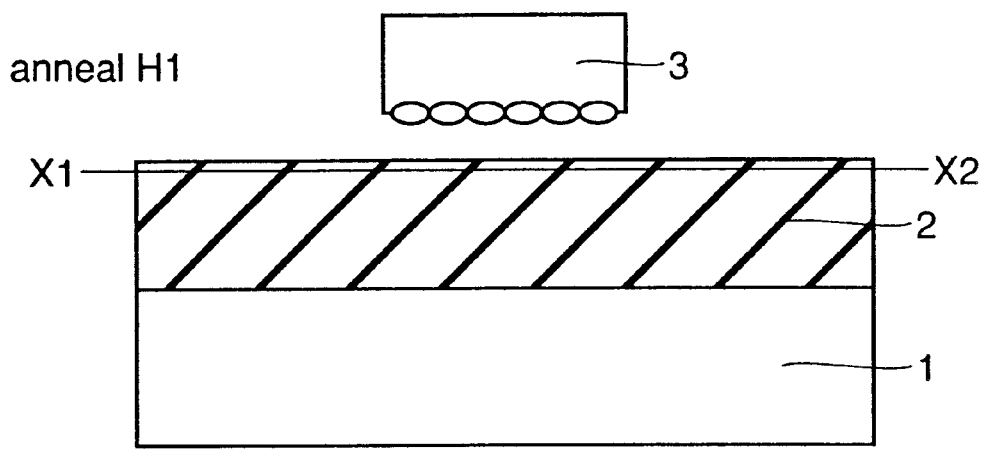
FIG. 7 is a diagram illustrating the step of heating an interlayer insulating film in Anneal H1 in a method for manufacturing a semiconductor according to Embodiment 4 of the present invention.
Figure 8:
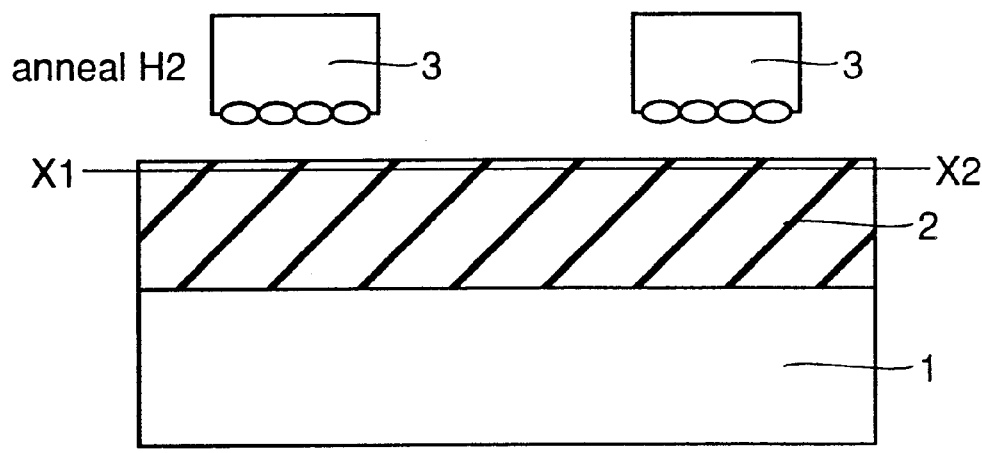
FIG. 8 is a diagram illustrating the step of conducting Anneal H2 after Anneal H1 of FIG. 7 in the manufacturing method of Embodiment 4.
Figure 9:
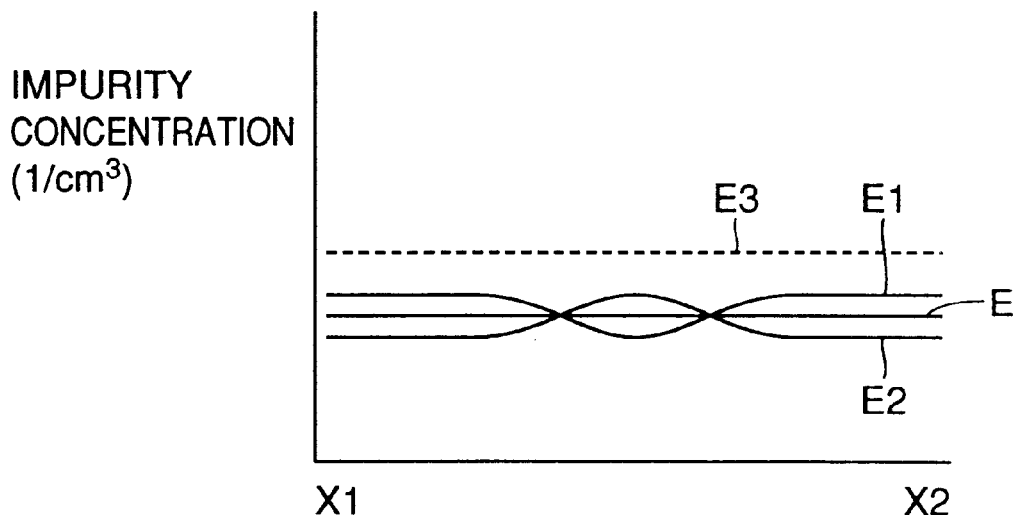
FIG. 9 is a diagram showing impurity-concentration distributions of the interlayer insulating film after Anneal H1 only, Anneal H2 only, and both Anneals H1 and H2, respectively.

In the present embodiment, interlayer insulating film 2 of the semiconductor device is heat-treated entirely in two steps (i.e., Anneals H1 and H2) by using an RTP apparatus 3, as shown in FIGS. 7 and 8. Respective out-diffusion of Anneals H1 and H2 is varied so that interlayer insulating film 2 finally has a uniform impurity-concentration distribution impurity-concentration after the two-step heat treatment. The heat treatment is not limited to two steps, and may be conducted in any number of steps. Interlayer insulating film 2 having a flat impurity-concentration distribution E3 (FIG. 9) along the line X1–X2 of FIGS. 7 and 8 before the heat treatment is subjected to Anneals H1 and H2. Provided that interlayer insulating film 2 subjected only to Anneal H1 and only to Anneal H2 has impurity-concentration distributions E1 and E2 as shown in FIG. 9, respectively, a flat impurity-concentration distribution E can be obtained by successively conducting Anneals H1 and H2. As a result, a highly flat interlayer insulating film can be obtained after the CMP process.

Note that, although the respective regions subjected to Anneals H1 and H2 do not overlap each other, the respective regions subjected to a plurality of steps of the heat treatment may overlap each other. For example, if an island region(s) having a high impurity concentration is produced in a earlier sample(s) as a result of prescribed heat treatment, such an island region(s) in a subsequent sample(s) is subjected to Anneal Hm for out-diffusion, so that an impurity concentration of the island region(s) is reduced. As a result, a uniform impurity-concentration distribution can be obtained. Since local, high-temperature, short-time heat treatment can be conducted in the anneal of the RTP, time and region of the heating can be arbitrarily controlled in each anneal step. Therefore, a highly flat interlayer insulating film having a uniform impurity-concentration distribution can be easily obtained.

(Embodiment 5)

Figure 10:
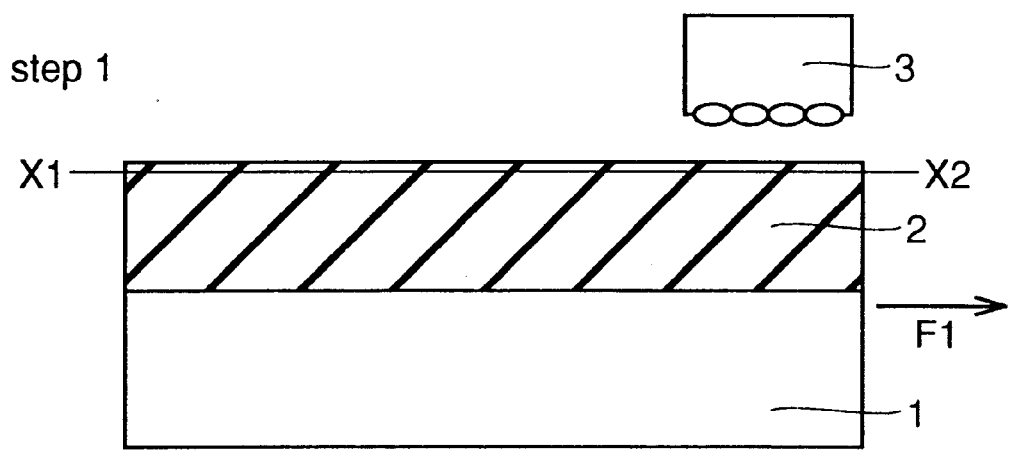
FIG. 10 is a diagram illustrating scan-heating of Step 1 in a method for manufacturing a semiconductor device according to Embodiment 5 of the present invention.
Figure 11:
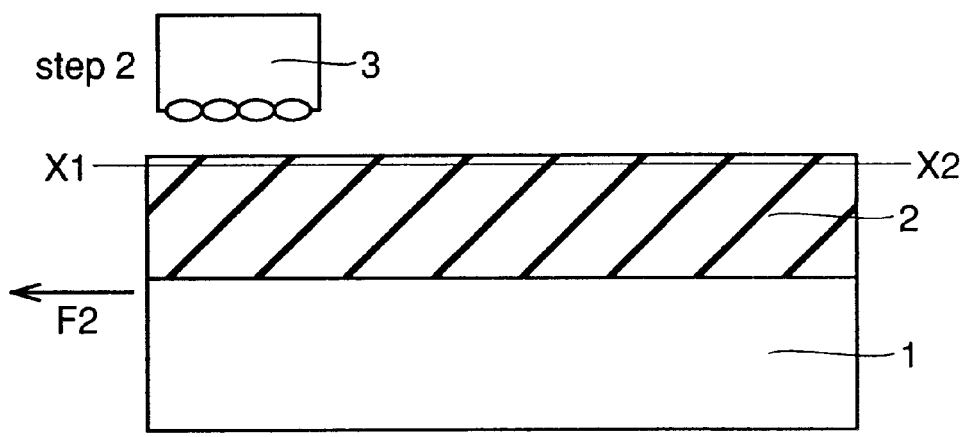
FIG. 11 is a diagram illustrating scan-heating of Step 2 that is conducted after Step 1 in the manufacturing method of Embodiment 5.
Figure 12:
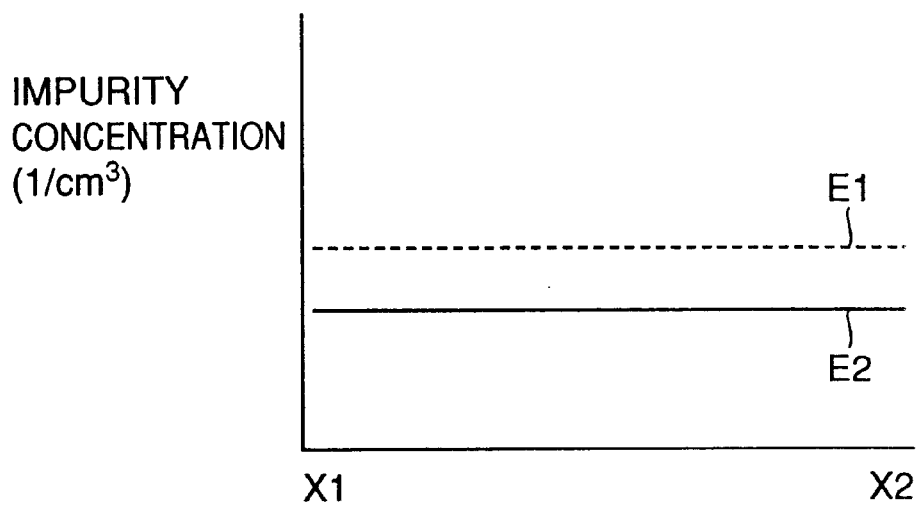
FIG. 12 is a diagram showing an impurity-concentration distribution after FIG. 11.

In the present embodiment, a wafer including interlayer insulting film 2 is scan-heated in the RTP. More specifically, in Step 1, RTP apparatus 3 scans the wafer from left to right as viewed in FIG. 10 (i.e., in the direction shown by the arrow F1). In Step 2, RTP apparatus 3 scans the wafer from right to left as viewed in FIG. 11 (i.e., in the direction shown by the arrow F2). Such a scan-heating method enables uniform temperature control, whereby non-uniform impurity out-diffusion is prevented in the RTP. Therefore, as shown in FIG. 12, interlayer insulating film 2, which has a uniform impurity-concentration distribution E1 along the line X1–X2 of FIGS. 10 and 11 before the heat treatment, has a uniform impurity-concentration distribution E2 even after the RTP. As a result, a highly flat interlayer insulating film can be obtained after the CMP process.

(Embodiment 6)

Figure 13:
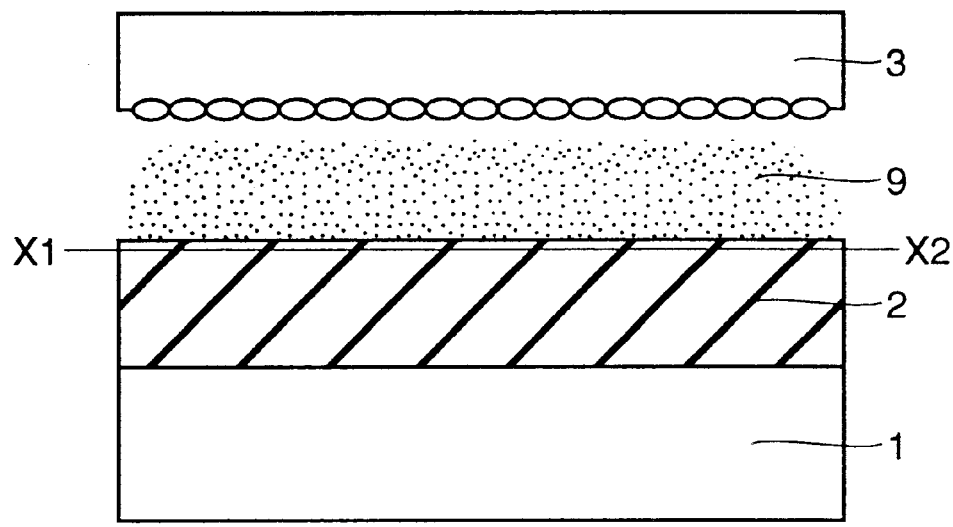
FIG. 13 is a diagram illustrating heat treatment using an active-gas atmosphere in a method for manufacturing a semiconductor device according to Embodiment 6 of the present invention.
Figure 14:
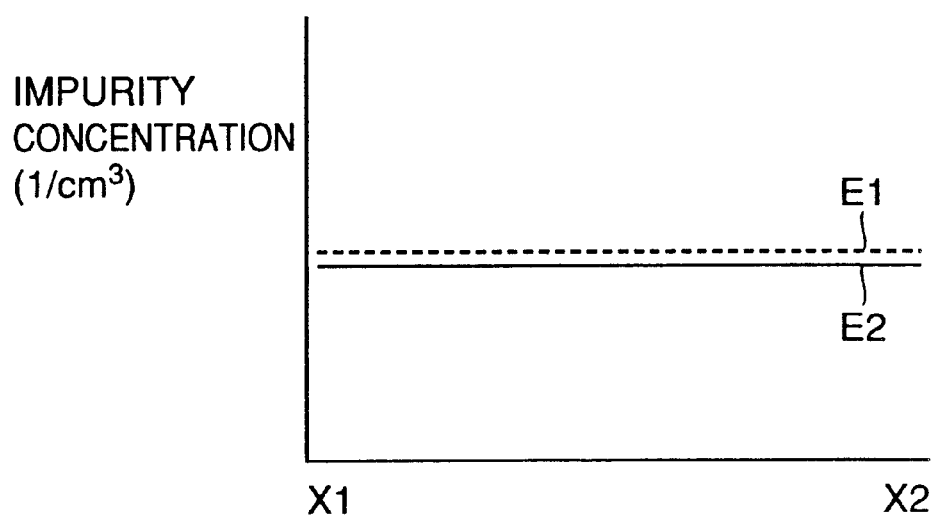
FIG. 14 is a diagram showing an impurity-concentration distribution that is obtained by the heat treatment of FIG. 13.
Figure 15:
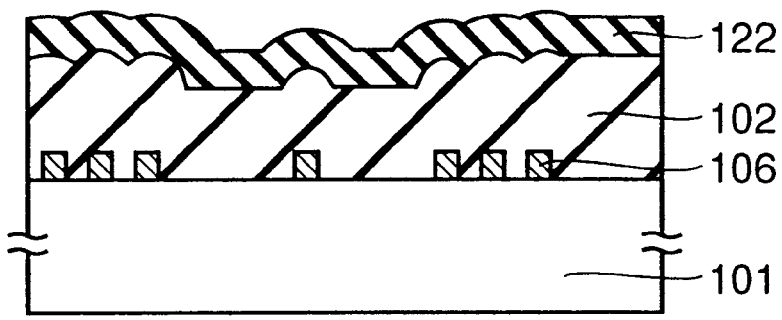
FIG. 15 is a diagram illustrating a conventional method for flattening an interlayer insulating film of a semiconductor device.
Figure 16:
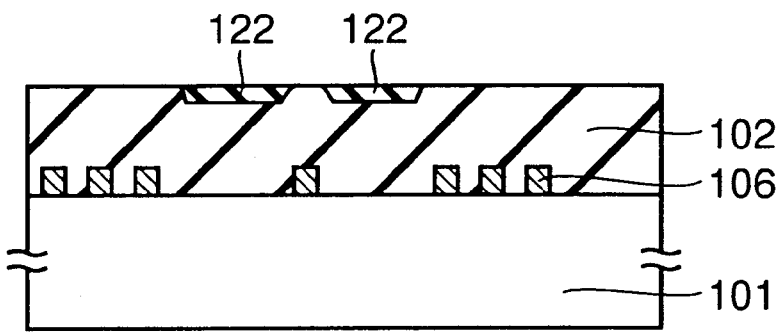
FIG. 16 is a diagram showing a state during polishing in the flattening method shown in FIG. 15.
Figure 17:
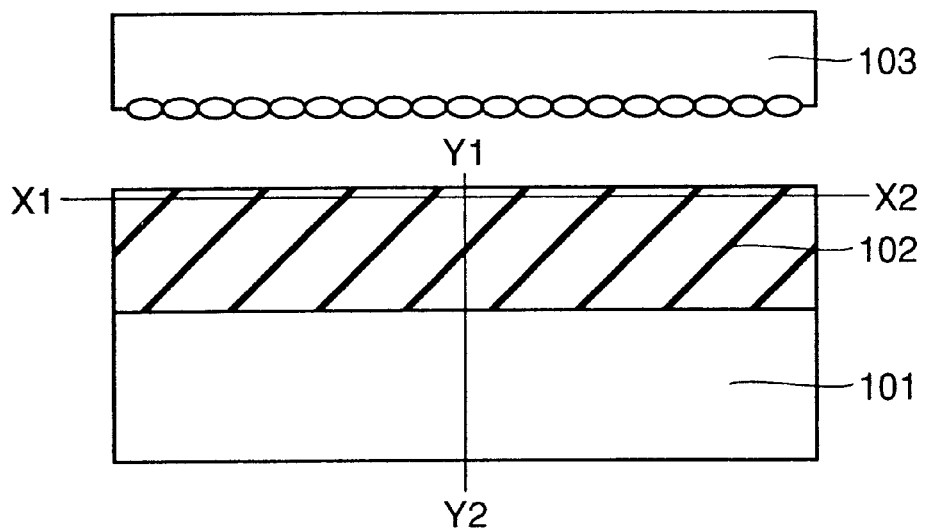
FIG. 17 is a diagram illustrating a heat-treatment process (RTP) in a conventional method for manufacturing a semiconductor device.
Figure 18:
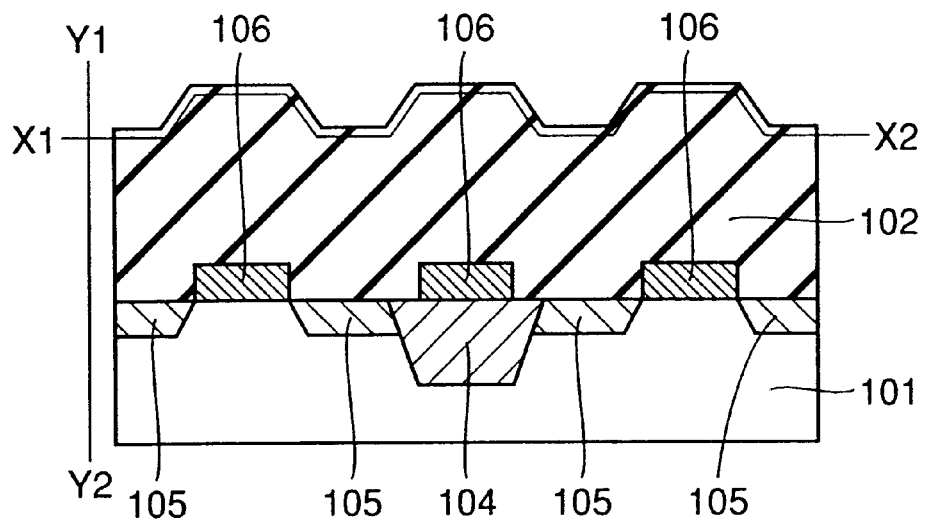
FIG. 18 is a diagram showing a schematic structure of a normal MOSFET.
Figure 19:
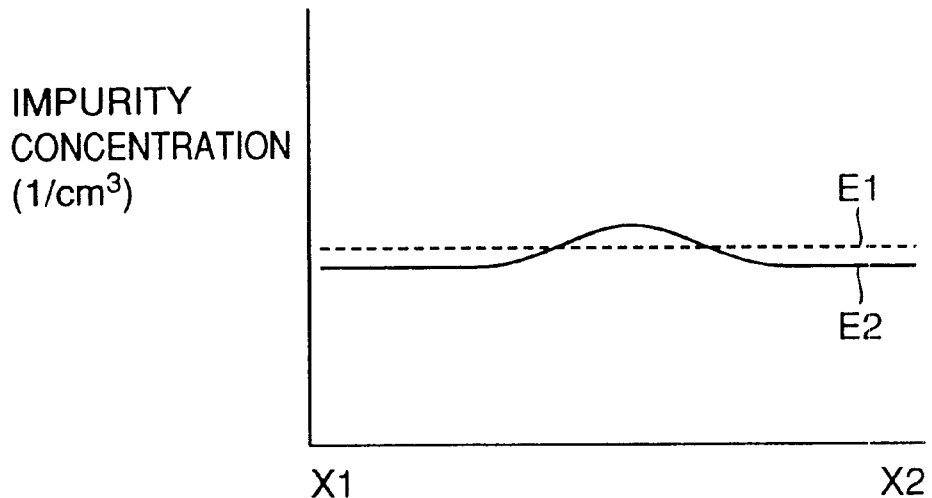
FIG. 19 is a diagram illustrating an impurity-concentration distribution of the interlayer insulating film of a conventional semiconductor device after the RTP.
Figure 20:
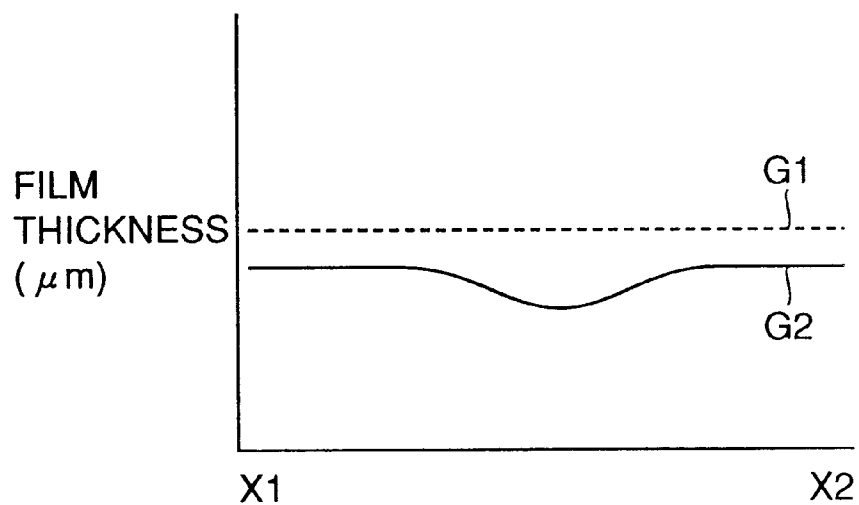
FIG. 20 is a diagram illustrating a film-thickness distribution of the interlayer insulating film of the conventional semiconductor device after a CMP process.

In the present embodiment, an active-gas atmosphere 9 as shown in FIG. 13 is used for the RTP or furnace anneal, instead of a conventionally used inactive-gas atmosphere such as nitrogen and rare gas. Out-diffusion of impurities contained in an insulating film can be suppressed by using the active gas such as an oxygen gas ($O_2$) or a nitrogen oxide gas ($NO_x$). As a result, as shown in FIG. 14, interlayer insulating film 2 having a uniform impurity concentration at its surface layer can be obtained. More specifically, interlayer insulating film 2, which has a uniform impurity-concentration distribution E1 along the line X1–X2 of FIG. 13 before the heat treatment, has a uniform impurity-concentration distribution E2 even after the heat treatment. As a result, a highly flat interlayer insulating film can be obtained after the CMP process, whereby a highly reliable, miniaturized semiconductor device can be provided.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A method for manufacturing a semiconductor device, comprising the steps of:

heat-treating a semiconductor device having an interlayer insulating film containing impurities;

conducting a process for making an impurity-concentration distribution at an upper layer portion of said interlayer insulating film substantially uniform after said heat treatment; and polishing said interlayer insulating film by a CMP (Chemical Mechanical Polishing) process after said process for making the impurity-concentration distribution substantially uniform.

2. A method for manufacturing a semiconductor device according to claim 1, wherein said process for making the impurity-concentration distribution substantially uniform includes the step of introducing impurities into the upper layer portion of said interlayer insulating film.

3. A method for manufacturing a semiconductor device according to claim 2, wherein the impurities are selectively introduced into a specific region of said interlayer insulating film.

4. A method for manufacturing a semiconductor device according to claim 2, wherein the impurities are introduced into a whole surface of said interlayer insulating film at a concentration higher than an original impurity concentration of said interlayer insulating film.

5. A method for manufacturing a semiconductor device according to claim 4, wherein the impurities are introduced by using an ion-implantation method, the impurities in a range of $10^{14}/cm^2$ to $5 \times 10^{15}/cm^2$ being implanted at 10 keV to 50 keV.

6. A method for manufacturing a semiconductor device according to claim 1, wherein said process for making the impurity-concentration distribution substantially uniform includes the step of conducting heating so as to cause out-diffusion of the impurities from the upper layer portion of said interlayer insulating film.

7. A method for manufacturing a semiconductor device according to claim 6, wherein a specific region of said interlayer insulating film is selectively heated to cause selective out-diffusion of the impurities.

8. A method for manufacturing a semiconductor device according to claim 6, wherein a whole surface of said interlayer insulating film is heated to cause out-diffusion of the impurities.

9. A method for manufacturing a semiconductor device, comprising the steps of:

heat-treating a semiconductor device having an interlayer insulating film containing impurities; and polishing the interlayer insulating film by a CMP process after said heat treatment, wherein said heat treatment is conducted so as to obtain a substantially uniform impurity-concentration distribution.

10. A method for manufacturing a semiconductor device according to claim 9, wherein said heat treatment conducted so as to obtain a substantially uniform impurity-concentration distribution includes the steps of depositing a non-doped interlayer insulating film on said interlayer insulating film containing the impurities, and heat-treating the semiconductor device including both the interlayer insulating film containing the impurities and the non-doped interlayer insulating film, and in said CMP process, said interlayer insulating films are polished down to an upper layer portion of said interlayer insulating film containing the impurities.

11. A method for manufacturing a semiconductor device according to claim 9, wherein said heat treatment conducted so as to obtain a substantially uniform impurity-concentration distribution includes the step of heat-treating said semiconductor device including said interlayer insulating film at its surface by using an active-gas atmosphere.

12. A method for manufacturing a semiconductor device according to claim 11, wherein said active gas is either an oxygen gas ($O_2$) or a nitrogen oxide gas ($NO_x$).

13. A method for manufacturing a semiconductor device according to claim 9, wherein said heat treatment conducted so as to obtain a substantially uniform impurity-concentration distribution includes the step of dividing said interlayer insulating film into a plurality of regions and heat-treating said interlayer insulating film on a region-by-region basis by using a region-based heating apparatus.

14. A method for manufacturing a semiconductor device according to claim 9, wherein said heat treatment conducted so as to obtain a substantially uniform impurity-concentration distribution includes the steps of:

heating a specific region of said semiconductor device by a partial heating apparatus; and scan-heating said semiconductor device, i.e., heating said semiconductor device while moving at least one of said semiconductor device and said partial heating apparatus, wherein said semiconductor is scan-heated in a reciprocating manner.

* * * * *